United States Patent
Yokoi et al.

(10) Patent No.: US 8,969,866 B2
(45) Date of Patent: Mar. 3, 2015

(54) SEMICONDUCTOR DEVICE AND METHOD FOR MANUFACTURING THE SAME

(75) Inventors: Tomokazu Yokoi, Kanagawa (JP); Kensuke Yoshizumi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 289 days.

(21) Appl. No.: 13/173,484

(22) Filed: Jun. 30, 2011

(65) Prior Publication Data

US 2012/0001180 A1 Jan. 5, 2012

(30) Foreign Application Priority Data

Jul. 2, 2010 (JP) ................................. 2010-151668

(51) Int. Cl.
*H01L 29/06* (2006.01)
*H01L 29/45* (2006.01)
*H01L 21/285* (2006.01)
*H01L 21/768* (2006.01)
*H01L 29/78* (2006.01)
*H01L 29/786* (2006.01)

(52) U.S. Cl.
CPC .......... *H01L 29/45* (2013.01); *H01L 21/28525* (2013.01); *H01L 21/76879* (2013.01); *H01L 29/458* (2013.01); *H01L 29/78* (2013.01); *H01L 29/7869* (2013.01); *H01L 2221/1094* (2013.01)
USPC ..................................... 257/43; 257/E23.168

(58) Field of Classification Search
None
See application file for complete search history.

(56) References Cited

U.S. PATENT DOCUMENTS

| | | | |
|---|---|---|---|
| 5,114,874 A * | 5/1992 | Custode .......................... | 438/227 |
| 7,015,496 B2 | 3/2006 | Ohnuma et al. | |
| 7,230,286 B2 | 6/2007 | Cohen et al. | |
| 7,396,409 B2 | 7/2008 | Hatta et al. | |
| 7,446,025 B2 | 11/2008 | Cohen et al. | |
| 7,713,828 B2 | 5/2010 | Yuki | |
| 7,749,905 B2 | 7/2010 | Cohen et al. | |
| 2002/0025614 A1* | 2/2002 | Jang et al. ....................... | 438/158 |
| 2002/0168574 A1 | 11/2002 | Ahn et al. | |

(Continued)

FOREIGN PATENT DOCUMENTS

| | | |
|---|---|---|
| JP | 61-248471 | 11/1986 |
| JP | 09-330977 A | 12/1997 |

(Continued)

OTHER PUBLICATIONS

Gangloff, L. et al, "Self-Aligned, Gated Arrays of Individual Nanotube and Nanowire Emitters," Nano Letters, vol. 4, No. 9, Sep. 1, 2004, pp. 1575-1579.

*Primary Examiner* — Fei Fei Yeung Lopez
(74) *Attorney, Agent, or Firm* — Husch Blackwell LLP

(57) ABSTRACT

Provided is a structure to obtain a reliable electrical contact through a narrow contact hole formed in an insulating layer, which is required in the miniaturization of a semiconductor device. An exemplified structure includes a thin film transistor comprising: a lower electrode over and in contact with a semiconductor layer, the lower electrode comprising a metal or a metal compound; an insulating layer over the lower electrode, the insulating layer having a contact hole reaching the lower electrode; a conductive silicon whisker grown from a surface of the lower electrode; and an upper electrode over the insulating layer and in contact with the conductive silicon whisker. The ability of the conductive silicon whisker grown from the lower electrode to ohmically contact with the lower and upper electrodes leads to a reliable electrical contact between the thin film transistor and a wiring.

24 Claims, 5 Drawing Sheets

(56) References Cited

U.S. PATENT DOCUMENTS

| | | | |
|---|---|---|---|
| 2004/0075464 A1* | 4/2004 | Samuelson et al. | 326/37 |
| 2006/0169972 A1* | 8/2006 | Furukawa et al. | 257/20 |
| 2006/0186451 A1* | 8/2006 | Dusberg et al. | 257/306 |
| 2006/0244065 A1* | 11/2006 | Yamada et al. | 257/347 |
| 2006/0273389 A1* | 12/2006 | Cohen et al. | 257/331 |
| 2008/0135908 A1* | 6/2008 | Choi et al. | 257/306 |
| 2008/0149914 A1* | 6/2008 | Samuelson et al. | 257/9 |
| 2008/0296557 A1* | 12/2008 | Kreupl et al. | 257/24 |
| 2008/0315430 A1* | 12/2008 | Weber et al. | 257/774 |
| 2009/0000192 A1* | 1/2009 | Norton et al. | 48/174 |
| 2009/0200536 A1 | 8/2009 | Van Schaijk et al. | |
| 2009/0206332 A1* | 8/2009 | Son et al. | 257/43 |
| 2010/0209784 A1 | 8/2010 | Yamazaki et al. | |
| 2011/0057163 A1* | 3/2011 | Liu et al. | 257/9 |
| 2011/0266654 A1 | 11/2011 | Kuriki et al. | |
| 2011/0289767 A1 | 12/2011 | Yamazaki | |
| 2011/0292564 A1 | 12/2011 | Yamazaki | |
| 2011/0294011 A1 | 12/2011 | Kuriki et al. | |
| 2011/0300445 A1 | 12/2011 | Murakami et al. | |
| 2011/0305950 A1 | 12/2011 | Kuriki et al. | |

FOREIGN PATENT DOCUMENTS

| | | |
|---|---|---|
| JP | 2004-224576 | 8/2004 |
| JP | 2006-332662 A | 12/2006 |
| JP | 2008-505476 | 2/2008 |
| JP | 2008-130756 | 6/2008 |
| JP | 2009-134917 | 6/2009 |
| WO | WO 2006/003620 A1 | 1/2006 |
| WO | PCT/JP2009060310 | * 12/2009 |

* cited by examiner

FIG. 3A1
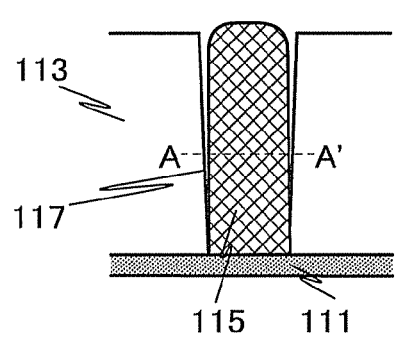
FIG. 3A2
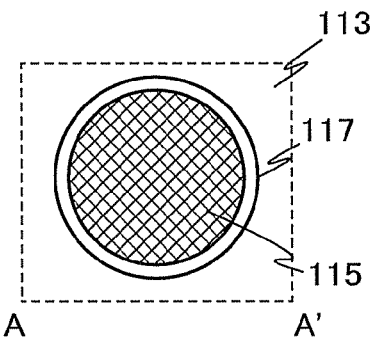
FIG. 3B1
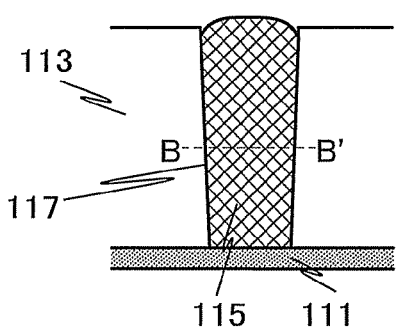
FIG. 3B2
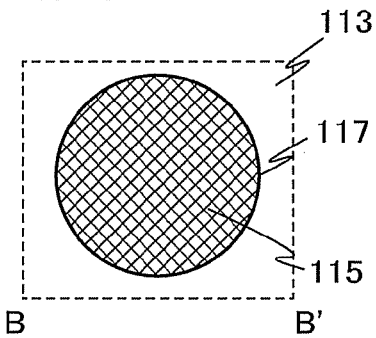
FIG. 3C1
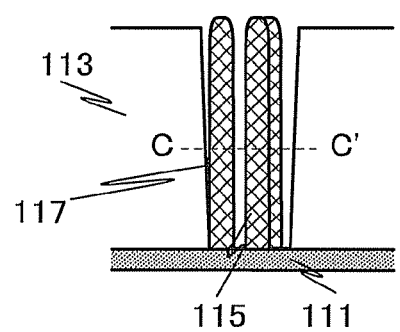
FIG. 3C2
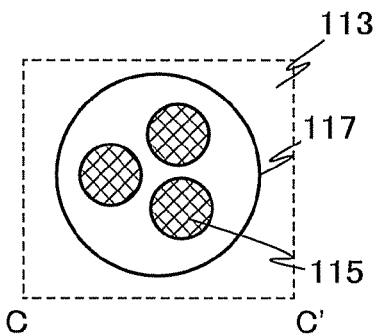
FIG. 3D1
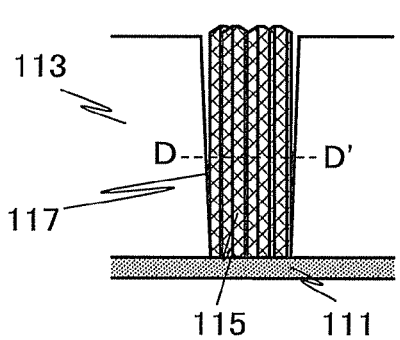
FIG. 3D2
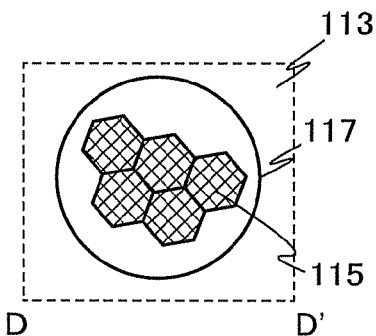

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device.

In this specification, a "semiconductor device" refers to a device which can function by utilizing semiconductor characteristics; an electro-optical device, a semiconductor circuit, and an electronic device, each of which uses a semiconductor element, are all included in the semiconductor devices.

2. Description of the Related Art

In recent years, high-density integration of a device element has required miniaturization of each element. Here, one of the problems is a contact defect induced by miniaturization.

A contact defect refers to a malfunction generated when poor connection occurs at a portion where a wiring electrode and a semiconductor device are electrically connected to each other (hereinafter also referred to as contact). In particular, the necessity of electrical connection through a narrow contact hole provided in an interlayer insulating layer has been increased in accordance with a miniaturization technique and multilevel interconnection technique.

In the case of a narrow contact hole with a high aspect ratio required by the miniaturization of a semiconductor device, there are problems in that disconnection of a wiring electrode occurs in the contact hole due to a coverage defect of a conductive film for forming a wiring electrode and an upper portion of the contact hole is blocked by the conductive film due to overhang of the conductive film so that the wiring electrode cannot be formed in the contact hole.

In order to solve the above problems, as described in Patent Document 1 for example, a method for obtaining electrical connection by using columnar single crystal silicon has been proposed. This method includes the formation of a columnar single crystal of silicon, over a single crystal silicon substrate, by the vapor-liquid-solid (VLS) growth method using a low-melting-point metal material such as gold, followed by doping the columnar single crystal of silicon with an impurity to provide conductivity. The doped columnar single crystal of silicon is used as a connection electrode.

As another technique, as described in Patent Document 2, a method has been proposed in which after a contact hole is formed to expose a source region or a drain region of a transistor formed over a single crystal silicon substrate, an epitaxial silicon layer containing an impurity is formed in the contact hole to form a connection electrode.

Reference

[Patent Document 1] Japanese Published Patent Application No. S61-248471
[Patent Document 2] Japanese Published Patent Application No. 2008-130756

SUMMARY OF THE INVENTION

However, a technique for forming minute contact which is typified by the above-mentioned technique has the following problem. In the case of forming a connection electrode between a semiconductor device such as a transistor and a wiring electrode, a columnar silicon layer used as a connection electrode is formed (deposited) over a semiconductor layer, which requires exposure of the semiconductor layer to a deposition atmosphere. However, when the columnar silicon layer is formed in such an environment, electric characteristics of the semiconductor device are adversely affected in some cases.

For example, it is important to form an n-channel transistor and a p-channel transistor over one substrate where silicon is used for a semiconductor layer in order to form a semiconductor circuit by a conventional CMOS technique or the like. The columnar silicon layer is formed over a source region and a drain region of each of these transistors. Specifically, the columnar silicon layer is formed over an n-type silicon layer in the n-channel transistor, and the columnar silicon layer is formed over a p-type silicon layer in the p-channel transistor. According to Patent Document 2, when a columnar silicon layer used for a connection electrode is formed, the columnar silicon layer is made to be an n-type silicon layer by adding a gas containing phosphorus. However, in this case, there is a problem in that a so-called PN junction is formed at an interface between the connection electrode and the source or drain region in the p-channel transistor and this electric barrier increases contact resistance. Further, according to Patent Document 1, in order to avoid this problem, the columnar silicon layers of the n-channel transistor and the p-channel transistor needs to be doped in two steps; however, it is difficult to form a doping mask covering the columnar silicon layer with a high aspect ratio and the manufacturing process simultaneously becomes complicated.

Furthermore, in the case of a semiconductor device having a transistor where a metal oxide semiconductor is used for a semiconductor layer, characteristics of the transistor are readily influenced by hydrogen contained in a deposition gas for forming the columnar silicon layer, such as a silane gas. Hydrogen in an oxide semiconductor easily forms a donor level in a band gap; therefore, there is a problem in that electric characteristics such as switching characteristics of the transistor are adversely affected when hydrogen contained in the deposition gas is diffused into the oxide semiconductor.

The present invention is made in view of the foregoing technical background. Accordingly, an object of one embodiment of the present invention is to provide a semiconductor device with favorable electric characteristics, in which a contact defect induced by miniaturization is reduced without damaging characteristics of a semiconductor element, and a method for manufacturing the semiconductor device.

In order to achieve the above object, in an embodiment of the present invention, a lower electrode which is electrically connected to a semiconductor layer and formed using a metal or a metal compound is provided and a conductive silicon whisker is formed over the lower electrode and used as a connection electrode in the contact.

That is, the lower electrode formed using a metal or a metal compound is provided over and in electrical contact with a top surface of the semiconductor layer, and the conductive silicon whisker to be a connection electrode is formed in a contact hole which is formed in an interlayer insulating layer to allow part of the lower electrode to be exposed. After that, an upper electrode which is electrically connected to the conductive silicon whisker may be formed. Further, a semiconductor device may be manufactured using the contact formed in this manner.

The silicon whisker to be a connection electrode can be grown from the lower electrode. Accordingly, even if a narrow contact hole with a high aspect ratio is demanded for miniaturization, the upper and lower electrodes can be electrically connected to each other reliably without disconnection.

Further, since part of the semiconductor layer which overlaps with the contact hole is covered with the lower electrode formed using a metal or a metal compound, the semiconductor layer is not exposed. The lower electrode serves as a protection film for the semiconductor layer in formation of the silicon whisker; therefore, a deposition gas and an impurity contained in the deposition gas are prevented from entering and diffusing into the semiconductor layer in formation of the silicon whisker.

Further, the silicon whisker to be a connection electrode is made n-type silicon or p-type silicon by diffusing impurity so that the silicon whisker becomes electrically conductive. Since the silicon whisker is in contact with the lower electrode formed using a metal or a metal compound, a junction between the silicon whisker and the lower electrode is almost an ohmic junction and an electric barrier thereof is extremely small. Furthermore, the kind of the impurity which is diffused into the silicon whisker is not limited because only the reduction of resistance of the silicon whisker is required; therefore, the silicon whisker can be formed in a single doping step.

A silicide layer which is formed by reaction of silicon included in the silicon whisker and a material included in the upper electrode may be formed between the silicon whisker to be a connection electrode and the upper electrode. The formation of the silicide layer can reduce the contact resistance between the connection electrode and the upper electrode.

That is, one embodiment of the present invention is a semiconductor device including a semiconductor layer; a lower electrode which is electrically connected to a top surface of the semiconductor layer; an insulating layer in which a contact hole is provided over the lower electrode and which covers the semiconductor layer; a connection electrode which includes a conductive silicon whisker and is in contact with the lower electrode in the contact hole; and an upper electrode which is electrically connected to the connection electrode and formed over the insulating layer.

Even when such a semiconductor device has a narrow contact hole with a high aspect ratio due to the miniaturization of a device, the upper and lower electrodes can be electrically connected to each other reliably without disconnection.

Another embodiment of the present invention is a semiconductor device in which the lower electrode includes a metal or a metal compound which includes a semiconductor included in the semiconductor layer and a metal.

When the lower electrode is formed using a metal or a metal compound, the contact resistance between the lower electrode and the conductive silicon whisker which is a connection electrode can be made small; therefore, a semiconductor device with small contact resistance can be manufactured.

Another embodiment of the present invention is a semiconductor device which has a silicide layer between the silicon whisker and the upper electrode.

When a silicide layer is formed between the silicon whisker and the upper electrode, the contact resistance between the silicon whisker and the upper electrode can be made small; therefore, a semiconductor device with small contact resistance can be manufactured.

Another embodiment of the present invention is a semiconductor device in which the connection electrode includes two or more conductive silicon whiskers.

When the connection electrode has a silicon whisker group including a plurality of silicon whiskers, a risk of disconnection is reduced and a contact defect can be reduced.

Another embodiment of the present invention is a method for manufacturing a semiconductor device including the steps of: forming a lower electrode which is electrically connected to a top surface of a semiconductor layer; forming an insulating layer which covers the semiconductor layer and the lower electrode; forming a contact hole which overlaps with the lower electrode in the insulating layer; forming a connection electrode which is in contact with the lower electrode in the contact hole and includes a conductive silicon whisker; and forming an upper electrode which is electrically connected to the connection electrode over the insulating layer.

Another embodiment of the present invention is a method for manufacturing a semiconductor device including the steps of: forming a metal film which is electrically connected to a top surface of a semiconductor layer; forming a metal compound layer which includes a material included in the semiconductor layer and a material included in the metal film and is in contact with the semiconductor layer; removing the metal film; forming an insulating layer which covers the semiconductor layer and the metal compound layer; forming a contact hole which overlaps with the metal compound layer in the insulating layer; forming a connection electrode which is in contact with the metal compound layer in the contact hole and includes a conductive silicon whisker; and forming an upper electrode which is electrically connected to the connection electrode over the insulating layer.

By such a method, a deposition gas and an impurity contained in the deposition gas can be prevented from entering and diffusing into the semiconductor layer in formation of the silicon whisker, so that a semiconductor device with favorable electric characteristics can be manufactured.

Note that "contact" in this specification and the like refers to a portion where a wiring electrode and a semiconductor device are electrically connected to each other. In addition, "contact" refers to a connection portion where an electrode included in a semiconductor device and a wiring electrode are electrically connected to each other through a connection electrode provided in a contact hole.

Further, in this specification and the like, the silicon whisker is a protrusion of crystalline silicon. In a plurality of silicon whiskers, the growth directions (i.e., the directions of axes) of protrusions may be different. The "silicon whisker" in this specification and the like may include a silicon whisker group (a plurality of silicon whiskers). Note that in this specification and the like, the term "crystalline" means not being amorphous and includes meanings of "single crystalline", "polycrystalline", "microcrystalline", and "quasicrystalline".

According to the present invention, a semiconductor device with favorable electric characteristics, in which characteristics of a semiconductor element is not damaged and a contact defect induced by miniaturization is reduced, and a method for manufacturing the semiconductor device are provided.

BRIEF DESCRIPTION OF THE DRAWINGS

In the accompanying drawings:

FIGS. 3A1 to 3D1 are cross-sectional views and FIGS. 3A2 to 3D2 are top views each illustrating the contact according to one embodiment of the present invention;

DETAILED DESCRIPTION OF THE INVENTION

Figure 1:
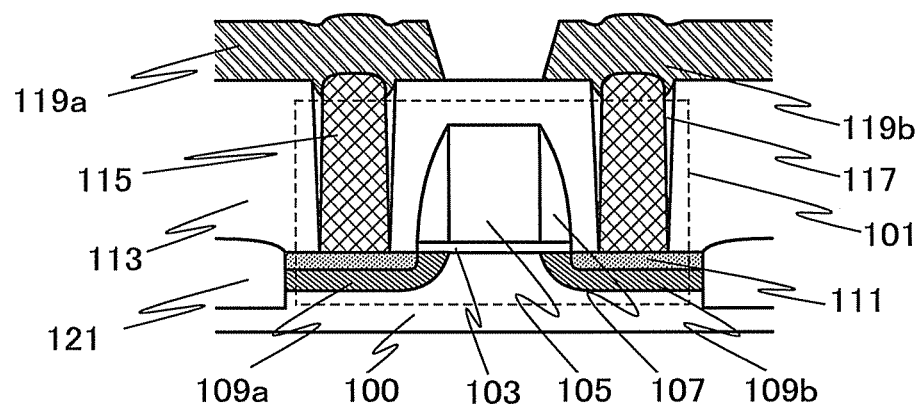
FIG. 1 is a cross-sectional view illustrating a transistor according to one embodiment of the present invention.

Embodiments will be described in detail with reference to drawings. Note that the present invention is not limited to the description below, and it is easily understood by those skilled in the art that modes and details can be modified in various ways without departing from the spirit and scope of the present invention. Therefore, the present invention should not be construed as being limited to the description in the following embodiments. Note that in the structures of the present invention described below, the same portions or portions having similar functions are denoted by the same reference numerals in different drawings, and description of such portions is not repeated.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

[Embodiment 1]

In this embodiment, a structure of a transistor and a method for manufacturing the transistor according to one embodiment of the present invention will be described with reference to FIG. 1, FIGS. 2A to 2D, and FIGS. 3A1 to 3D2.

<Structure Example of Transistor>

A schematic cross-sectional view of a transistor 101 in this embodiment is illustrated in FIG. 1.

The transistor 101 includes a channel formation region provided in a substrate 100 which contains a semiconductor material (e.g., silicon); a source region 109a and a drain region 109b which are provided so as to sandwich the channel formation region therebetween; a gate insulating layer 103 provided on and in contact with the channel formation region; and a gate electrode layer 105 which is in contact with the gate insulating layer 103 and overlaps with the channel formation region. Sidewalls 107 are provided on side surfaces of the gate electrode layer 105. A metal compound layer 111 is provided over each of the source region 109a and the drain region 109b. Further, an interlayer insulating layer 113 which covers the metal compound layer 111, the gate insulating layer 103, the sidewalls 107, and the gate electrode layer 105 is formed. The interlayer insulating layer 113 has a contact hole 117 reaching the metal compound layer 111. A silicon whisker 115 in contact with the metal compound layer 111 is provided in the contact hole 117. An upper portion of the silicon whisker 115 is in contact with a source wiring layer 119a or a drain wiring layer 119b which are provided over the interlayer insulating layer 113.

Note that the transistor 101 may be either an n-channel transistor or a p-channel transistor.

An element isolation layer 121 for electrically separating adjacent semiconductor elements, which are not illustrated, from the transistor 101 is embedded in the substrate 100 as illustrated in FIG. 1.

The silicon whisker 115 serves as a connection electrode and an impurity is diffused thereinto to have conductivity. Further, a lower portion of the silicon whisker 115 is electrically connected to the source region 109a or the drain region 109b through the metal compound layer. On the other hand, an upper portion of the silicon whisker 115 is in contact with and electrically connected to the source wiring layer 119a or the drain wiring layer 119b. Accordingly, the source region 109a and the drain region 109b in the transistor 101 are electrically connected to the source wiring layer 119a and the drain wiring layer 119b, respectively, through the metal compound layers 111 and the silicon whiskers 115.

The metal compound layer 111 includes part of the source region 109a or the drain region 109b into which an impurity is diffused and comprises a low-resistance metal compound which is obtained by reaction between a metal and a semiconductor included in the source region 109a or the drain region 109b. Accordingly, regardless of the conductivity type (n-type or p-type) of the silicon whisker 115 that is in contact with the metal compound layer 111, the junction formed between the metal compound layer 111 and the silicon whisker 115 is almost an ohmic junction and an electric barrier thereof is extremely small. Further, regardless of the conductivity type (n-type or p-type) of the source region 109a and the drain region 109b, the conductivity of the silicon whisker 115 does not matter and the silicon whisker 115 having the same conductivity type can be used as a connection electrode.

Note that a silicide may be formed by reaction between a metal and silicon at an interface between an upper end of the silicon whisker 115 and the source wiring layer 119a or the drain wiring layer 119b. When a silicide is formed, the contact resistance between the silicon whisker 115 and the source wiring layer 119a or the drain wiring layer 119b is reduced, which is preferable.

<Example of Manufacturing Process>

Next, an example of a method for manufacturing a transistor which is one embodiment of the present invention will be described. A method for manufacturing a transistor 101 will be described below with reference to FIGS. 2A to 2D and FIGS. 3A1 to 3D2.

First, a substrate 100 including a semiconductor material is prepared. A single crystal semiconductor substrate of silicon, silicon carbide, or the like; a microcrystalline semiconductor substrate; a compound semiconductor substrate of silicon germanium or the like; an SOI substrate, or the like can be used as the substrate 100 including a semiconductor material. Here, an example of using a single crystal silicon substrate as the substrate 100 including a semiconductor material will be shown. Note that in general, the "SOI substrate" means a substrate in which a silicon semiconductor layer is provided on an insulating surface. In this specification and the like, the "SOI substrate" also includes a substrate in which a semiconductor layer including a material other than silicon is provided over an insulating surface in its category. That is, the "SOI substrate" includes a structure in which a semiconductor layer is provided over an insulating substrate such as a glass substrate with an insulating layer interposed therebetween.

Next, the element isolation layer 121 is formed over the substrate 100.

A protective layer serving as a mask for forming the element isolation layer 121 is formed over the substrate 100. As the protective layer, an insulating film including a material such as silicon oxide, silicon nitride, or silicon nitride oxide can be used, for example. Note that before or after this step, an impurity element imparting n-type conductivity or an impurity element imparting p-type conductivity may be added to the substrate 100 in order to control the threshold voltage of the transistor. In the case where the semiconductor material included in the substrate 100 is silicon, phosphorus, arsenic, or the like can be used as an impurity imparting n-type conductivity. In contrast, boron, aluminum, gallium, or the like can be used as the impurity imparting p-type conductivity.

Next, part of the substrate 100 in a region that is not covered with the protective layer 102 (i.e., in an exposed region) is removed by etching, using the protective layer as a mask.

Thus, an isolated semiconductor region is formed. As the etching, dry etching is preferably performed, but wet etching may be performed. An etching gas and an etchant can be selected as appropriate depending on the material of the substrate to be etched.

Then, an insulating layer is formed so as to cover the entire substrate 100, and the insulating layer in a region overlapping with the semiconductor region is selectively removed, whereby the element isolation layer 121 is formed. The insulating layer is formed using silicon oxide, silicon nitride, silicon nitride oxide, or the like. As a method for removing the insulating layer, polishing treatment such as chemical mechanical polishing (CMP), etching treatment, and the like can be given, and any of the above treatment may be used. Note that the protective layer is removed after the formation of the semiconductor region or after the formation of the element isolation layer 121.

Then, an insulating layer is formed over the substrate 100 and a layer containing a conductive material is formed over the insulating layer.

The insulating layer later serves as the gate insulating layer 103 and may have a single-layer structure or a stacked-layer structure using a film containing silicon oxide, silicon oxynitride, silicon nitride oxide, silicon nitride, hafnium oxide, aluminum oxide, tantalum oxide, yttrium oxide, hafnium silicate ($HfSi_xO_y$ (x>0, y>0)), hafnium silicate to which nitrogen is added, hafnium aluminate ($HfAl_xO_y$ (x>0, y>0)) to which nitrogen is added, or the like which can be formed by a CVD method, a sputtering method, or the like. Alternatively, the surface of the substrate 100 may be oxidized or nitrided by high-density plasma treatment or heat treatment (such as thermal oxidation treatment or thermal nitridation treatment), whereby the insulating layer is formed. The high-density plasma treatment can be performed using, for example, a mixed gas of a rare gas such as He, Ar, Kr, or Xe and a gas such as oxygen, nitrogen oxide, ammonia, or nitrogen. There is no particular limitation on the thickness of the insulating layer; the insulating layer can have a thickness of greater than or equal to 1 nm and less than or equal to 100 nm, for example.

The layer containing a conductive material can be formed using a metal material such as aluminum, copper, titanium, tantalum, or tungsten. The layer containing a conductive material may be formed using a semiconductor material such as polycrystalline silicon containing a conductive material. There is no particular limitation on the method for forming the layer containing a conductive material, and any kind of film formation methods such as an evaporation method, a CVD method, a sputtering method, and a spin coating method can be employed. Note that this embodiment shows an example of the case where the layer containing a conductive material is formed using a metal material.

After that, the layer containing the conductive material is selectively etched to form the gate electrode layer 105.

Next, the sidewall 107 is formed. An insulating layer is formed so as to cover the gate electrode layer 105 and then subjected to highly anisotropic etching, whereby the sidewall 107 can be formed in a self-aligned manner.

Note that by the etching performed when the sidewall 107 is formed, a portion of the insulating layer which is to be the gate insulating layer 103, which is not covered with the gate electrode layer 105 and the sidewall 107, is etched at the same time to form the gate insulating layer 103.

By provision of the sidewall 107, impurity regions to which an impurity element is added at a different concentration can be formed in a later step of adding an impurity. Thus, adverse effects such as a short channel effect can be suppressed, which is preferable. Note that when high integration is required, a structure without a sidewall is employed, whereby the size of the transistor can be reduced.

Next, an impurity such as phosphorus or arsenic is added using the gate electrode layer 105 and the sidewalls 107 as masks, whereby the source region 109a and the drain region 109b are formed. Note that an impurity element such as boron or aluminum is added here in order to form an p-channel transistor; however, an impurity element such as phosphorus or arsenic may be added in the case of forming an n-channel transistor. The concentration of the impurities added can be set as appropriate; the concentration of the impurities added is preferably increased in the case where the semiconductor element is highly minimized. Note that it is preferable to perform heat treatment after an impurity element is added, in order to activate the impurity element or reduce defects which may be generated during addition of the impurity element. This heat treatment can double as the step of forming the silicon whisker 115 described later.

Figure 2A:
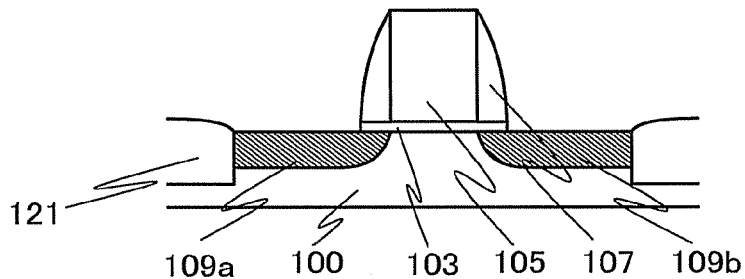
FIGS. 2A to 2D are cross-sectional views illustrating a method for manufacturing a transistor according to one embodiment of the present invention.

FIG. 2A illustrates a schematic cross-sectional view at this stage.

Next, the metal compound layer 111 is formed.

First, a metal layer 123 which covers the gate electrode layer 105, the sidewalls 107, the source region 109a, and the drain region 109b is formed. The metal layer 123 can be formed by any kind of film formation methods such as a vacuum evaporation method, a CVD method, a sputtering method, and a spin coating method. The metal layer 123 is formed using a metal material which can generate a low-resistance metal compound by reacting with the semiconductor material included in the substrate 100. Further, the material is selected so that the metal compound can form the silicon whisker to be formed later thereon. That is, a material containing a metal element which functions as a catalyst for promoting growth of the silicon whisker can be selected. For example, a metal element which forms a silicide, such as titanium, nickel, cobalt, or iron, can be preferably used.

Next, heat treatment is performed, whereby the metal layer 123 reacts with the semiconductor material. Thus, the metal compound layers 111 in contact with the source region 109a and the drain region 109b are formed. Note that when the gate electrode layer 105 is formed using polycrystalline silicon or the like, a metal compound region is also formed in a portion of the gate electrode layer 105 which is in contact with the metal layer 123.

Figure 2B:
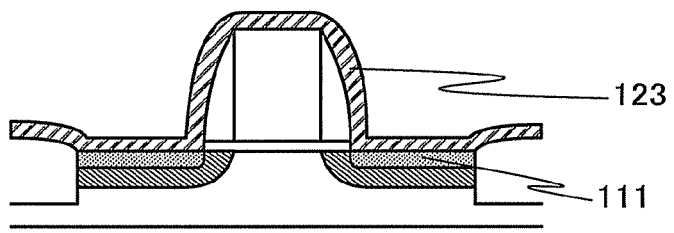

As the heat treatment, irradiation with a flash lamp can be employed, for example. Although it is needless to say that another heat treatment method may be used, a method by which heat treatment can be achieved in an extremely short time is preferably used in order to improve the controllability of chemical reaction in formation of the metal compound. Note that the metal compound layers 111 are formed by the reaction of the metal material and the semiconductor material and have sufficiently high conductivity. By formation of the metal compound layers 111, electric resistance can be sufficiently reduced and element characteristics can be improved. FIG. 2B is a schematic cross-sectional view at this stage.

After formation of the metal compound layers 111, the metal layer 123 is removed.

Next, the interlayer insulating layer 113 is formed so as to cover the components formed in the above steps. The interlayer insulating layer 113 can be formed to have a single-layer structure or a stacked-layer structure using a film including an inorganic insulating material such as silicon oxide, silicon oxynitride, silicon nitride oxide, silicon nitride, aluminum oxide, hafnium oxide, or tantalum oxide. Alternatively, the interlayer insulating layer 113 can be formed using an organic insulating material such as a polyimide or an acrylic resin as long as it can withstand heat treatment in a later step. After formation of the insulating film which is to be the interlayer insulating layer 113, the surface of the insulating film is preferably planarized by CMP, etching treatment, or the like. A malfunction such as disconnection of wiring layers such as the source wiring layer 119a and the drain wiring layer 119b to be formed later can be prevented by the planarization, which is preferable. Note that the planarization treatment is not necessarily performed if not necessary because the process can be simplified.

Next, contact holes 117 which reach a pair of the metal compound layers 111 are formed in the interlayer insulating layer 113. As etching of the interlayer insulating layer 113 in forming the contact holes 117, a method in which the etching selectivity ratio of the interlayer insulating layer 113 with respect to the metal compound layers 111 is high can be used. When a semiconductor element is highly miniaturized, anisotropic dry etching is preferably performed in order to suppress the expansion of the contact holes due to the etching.

Next, the silicon whisker 115 is formed in the contact hole 117.

The silicon whisker 115 can be formed over the metal compound layer 111 by a thermal CVD method, preferably, a low-pressure chemical vapor deposition (LPCVD) method. The silicon whisker 115 can be selectively grown from the metal compound layer 111 by a LPCVD method. Note that oxygen or the like derived from a chamber of the LPCVD apparatus is contained as an impurity in the silicon whisker 115 in some cases.

In this embodiment, the silicon whisker 115 is formed by a LPCVD method. In performing a LPCVD method, heating is performed at a temperature higher than 550° C. and lower than or equal to a temperature which an apparatus or the components formed in the above-described steps can withstand, preferably a temperature higher than or equal to 580° C. and lower than 650° C., and a deposition gas including silicon is used as a source gas. Examples of the deposition gas containing silicon include silicon hydride, silicon fluoride, and silicon chloride; typically, $SiH_4$, $Si_2H_6$, $SiF_4$, $SiCl_4$, $Si_2Cl_6$, and the like are given. Note that one or more of a rare gas such as helium, neon, argon, and xenon; nitrogen; hydrogen; and the like may be mixed in the source gas.

Further, an impurity element imparting one conductivity type is added during formation of the silicon whisker 115 so that the silicon whisker 115 has conductivity. As an impurity element imparting one conductivity type which is suitable for a LPCVD method, phosphorus, arsenic, and the like can be given in order to impart n-type conductivity; on the other hand, boron and the like can be given in order to impart p-type conductivity.

The conductivity of the silicon whisker 115 may be either n-type or p-type and it is acceptable as long as the resistance of the silicon whisker 115 is sufficiently reduced. The metal compound layer 111 in contact with the silicon whisker comprises a low-resistance metal compound. Thus, regardless of the conductivity type of the silicon whisker, a junction between the silicon whisker 115 and the metal compound layer 111 is almost an ohmic junction and an electric barrier thereof is extremely small. Thus, the contact resistance between the metal compound layer 111 and the silicon whisker 115 is small and the resistance of the silicon whisker itself is reduced; therefore, low-resistance contact can be realized.

In this embodiment, as an impurity element imparting one conductivity type, phosphorus is used and the silicon whisker 115 is formed using silicon having n-type conductivity.

Further, since the silicon whisker 115 is formed by a method including a heating step, such as a LPCVD method, heat treatment for activating an impurity element added to the source region 109a and the drain region 109b which are described above and repairing a defect generated during addition of an impurity element can be performed at the same time.

The silicon whisker 115 has crystallinity. Further, a growth direction of the silicon whisker 115 and at least one of crystal orientations of crystals included in the silicon whisker 115 may be substantially the same. Such a silicon whisker 115 is superior in electric conductivity as compared to normal polycrystalline silicon or microcrystalline silicon without regularity in crystal orientation, or amorphous silicon. Accordingly, the formation of the contact using the silicon whisker 115 having crystallinity allows the formation of the low-resistance contact.

Further, there is no particular limitation on the shape of the silicon whisker 115 as long as the silicon whisker 115 is a crystalline protrusion. For example, the silicon whisker 115 may have a columnar shape such as a cylinder shape or a prism shape, or a needle shape such as a circular cone shape or a pyramidal shape. Furthermore, the apex of the silicon whisker may have a curved shape. The diameter of the silicon whisker is greater than or equal to 50 nm and less than or equal to the diameter of the contact hole, preferably greater than or equal to 100 nm and less than or equal to 3 μm.

Further, a space may be provided between the silicon whisker 115 and a wall surface of the contact hole 117 or the contact hole 117 may be completely filled with the silicon whisker 115. When a space is provided between the silicon whisker 115 and the wall surface of the contact hole 117, a contact area with an upper electrode to be formed later becomes large; therefore, contact resistance thereof can be reduced. Alternatively, when the contact hole 117 is completely filled with the silicon whisker 115, the mechanical strength becomes high; therefore, a contact defect does not occur easily even if external force or the like is applied.

Further alternatively, a silicon whisker group including a plurality of silicon whiskers may be formed in one contact hole. At this time, the silicon whiskers may be in contact with each other or may have an interval. Furthermore, two or more silicon whiskers may be formed in a bundle form. The silicon whisker group is used as a connection electrode, whereby even if one of the silicon whiskers is disconnected, an electric connection is kept by another silicon whisker; therefore, a risk of disconnection becomes lower and a contact defect can be reduced.

In forming the silicon whisker 115 in the contact hole 117 by a LPCVD method, the silicon whisker 115 is not formed over the interlayer insulating layer 113. However, a thin silicon thin film such as an amorphous silicon film, a polysilicon film, or a microcrystalline silicon film is formed over the interlayer insulating layer 113 in some cases.

An unnecessary silicon thin film formed over the interlayer insulating layer 113 is removed by etching. At this time, only the silicon thin film may be removed under a condition that the etching selectivity ratio of the silicon thin film with respect to the silicon whisker 115 is high using the difference in etching rate which is derived from the difference in crystallinity between the silicon whisker 115 and the silicon thin film formed over the interlayer insulating layer 113. Note that when the silicon thin film is not formed over the interlayer insulating layer 113, this step can be omitted.

Figure 2C:
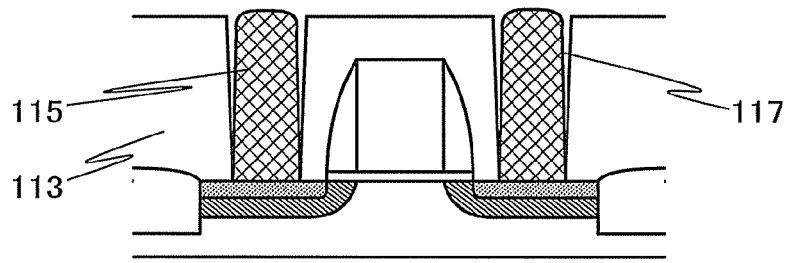

FIG. 2C illustrates a schematic cross-sectional view at this stage.

Next, the source wiring layer 119a and the drain wiring layer 119b are formed.

First, a conductive film is formed. The conductive film can be formed using a single layer or a stacked layer of a film which is formed using a metal material such as aluminum, copper, titanium, tantalum, and tungsten. There is no particular limitation on the method for forming the conductive film, and any kind of film formation methods such as an evaporation method, a CVD method, a sputtering method, and a spin coating method can be employed. After that, the conductive film is selectively etched to form the source wiring layer 119a and the drain wiring layer 119b.

Note that after formation of the conductive film, reaction between the metal included in this conductive film and the silicon whisker 115 occurs and a silicide is formed at an interface between the silicon whisker 115 and the conductive film in some cases. Formation of a silicide reduces the contact resistance between the silicon whisker 115 and the conductive film, which is preferable.

Figure 2D:
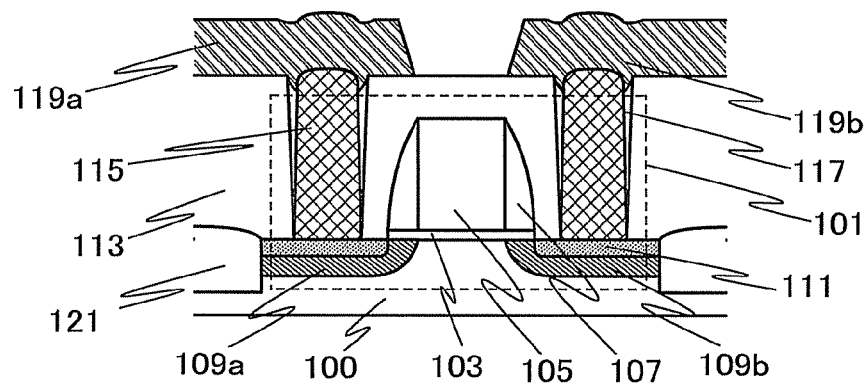

Through the above steps, the transistor 101 is formed. FIG. 2D illustrates a schematic cross-sectional view at this stage.

Note that depending on the formation conditions of the silicon whisker 115, the silicon whisker 115 in the contact hole 117 can have various shapes. FIGS. 3A 1 to 3D2 illustrate shapes of the silicon whisker 115. FIG. 3A1, FIG. 3B1, FIG. 3C1, and FIG. 3D1 are schematic cross-sectional views each illustrating the vicinity of the contact hole 117. FIG. 3A2, FIG. 3B2, FIG. 3C2, and FIG. 3D2 are schematic top views taken along dashed lines in FIG. 3A1, FIG. 3B1, FIG. 3C1, and FIG. 3D1, respectively. The silicon whisker 115 illustrated in FIG. 3A1 and FIG. 3A2 has one columnar shape and has a space between the wall surface of the contact hole 117 and the silicon whisker 115. The space allows the upper electrode to be contacted with a side surface of the silicon whisker 115. Accordingly, the contact area between the upper electrode and the silicon whisker 115 becomes large, whereby the contact resistance therebetween can be reduced. In FIGS. 3B1 and 3B2, the inside of the contact hole 117 is filled with the silicon whisker 115 without a space. Accordingly, mechanical strength is increased, a contact defect does not occur easily even if external force or the like is applied. Alternatively, as illustrated in FIGS. 3C1 and 3C2, the fine column-like silicon whiskers 115 may be provided spaced from each other. In such a structure, the contact area between the silicon whiskers 115 and the upper electrode can be made larger. The silicon whiskers 115 illustrated in FIGS. 3D1 and 3D2 have a prism shape. A plurality of silicon whiskers 115 are in contact with each other, which forms a silicon whisker group. A plurality of silicon whiskers are in contact with each other, whereby the mechanical strength can be increased. The shapes of the silicon whisker 115 are not limited to the shapes described here and it is needless to say that the silicon whisker 115 can have a variety of shapes as long as the silicon whisker 115 is a crystalline protrusion.

The thus manufactured transistor has no adverse effect such as disconnection of the connection electrode on a contact hole which is narrow and has a high aspect ratio due to the high integration, whereby favorable contact can be obtained. Further, the transistor has no defect caused by a deposition gas in formation of the silicon whisker in the contact hole, whereby the transistor having favorable electric characteristics can be formed.

Note that in the case of using a multilayer wiring required by the high integration, a connection wiring generally needs to be formed at the stage of forming each layer; however, by a method for forming contact in which the above-described silicon whisker is used as a connection wiring, the silicon whisker can be electrically connected directly with a wiring layer which is over a second layer. For example, after formation of an interlayer insulating layer which is over the second layer, a contact hole reaching a metal compound layer formed over a source or drain region of a transistor may be formed, and a silicon whisker having conductivity and a wiring layer may be formed by the above-described method.

Note that in this embodiment, a structure of a transistor and a method for manufacturing the transistor are exemplified. However, a method for forming the contact where a conductive silicon whisker, which is in contact with a lower electrode formed using a metal compound at the bottom of a contact hole, is used as a connection electrode can be applied to a semiconductor device which has a connection portion of wirings through an interlayer insulating layer, such as a diode element, a capacitor, or a resistor. Also in the case where the method is applied to these semiconductor devices, there is no adverse effect such as disconnection of the connection electrode in a narrow contact hole having a high aspect ratio due to the high integration of the devices, so that a semiconductor device having reliable contact can be obtained.

In accordance with the structure of the semiconductor device and the method for manufacturing the semiconductor device which are exemplified in this embodiment, a semiconductor device with favorable electric characteristics in which characteristics of a semiconductor element is not damaged and a contact defect resulted from the miniaturization is reduced can be realized.

Note that this embodiment can be combined with another embodiment described in this specification as appropriate.

[Embodiment 2]

In this embodiment, a structure of a transistor and a method for manufacturing the transistor, according to one embodiment of the present invention, which are different from those described in Embodiment 1, will be described with reference to FIGS. 4A and 4B, and FIGS. 5A to 5D.

<Structure Example of Transistor>

Figure 4A:
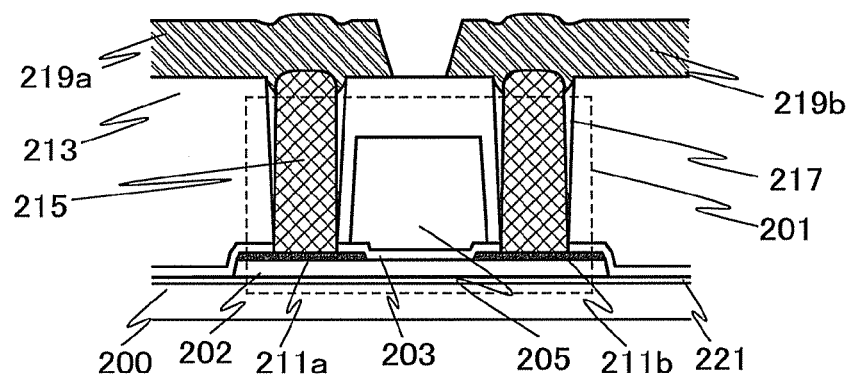
FIGS. 4A and 4B are cross-sectional views each illustrating a transistor according to one embodiment of the present invention.

FIG. 4A illustrates a schematic cross-sectional view of a transistor 201 exemplified in this embodiment. The transistor 201 is one of top-gate transistors in which an oxide semiconductor is used for a semiconductor layer.

The transistor 201 includes a base layer 221 over a substrate 200; an oxide semiconductor layer 202 having a channel formation region; a source electrode layer 211a and a drain electrode layer 211b which are in contact with the oxide semiconductor layer 202 and provided so as to sandwich the channel formation region therebetween; a gate insulating layer 203 provided in contact with the channel formation region; and a gate electrode layer 205 which is in contact with the gate insulating layer 203 and overlaps with the channel formation region and end portions of the source electrode layer 211a and the drain electrode layer 211b which face each other. In addition, the transistor 201 includes an interlayer insulating layer 213 which covers all of the above-described components. The interlayer insulating layer 213 has a contact hole 217 reaching the source electrode layer 211a or the drain electrode layer 211b. In the contact hole 217, a silicon whisker 215 in contact with the source electrode layer 211a or the drain electrode layer 211b is provided and an upper portion of the silicon whisker 215 is in contact with a source wiring layer 219a or a drain wiring layer 219b provided over the interlayer insulating layer 213.

The silicon whisker 215 is formed using conductive silicon into which an impurity is diffused, as in Embodiment 1. Accordingly, the source electrode layer 211a or the drain electrode layer 211b (hereinafter also collectively referred to as lower electrodes) are electrically connected to the source wiring layer 219a or the drain wiring layer 219b (hereinafter also collectively referred to as upper electrodes), respectively. Further, a junction between the silicon whisker 215 and the lower electrode and a junction between the silicon whisker 215 and the upper electrode are almost ohmic junctions; therefore, an electric barrier thereof is extremely small. Therefore, favorable low-resistance contact can be obtained.

A region of the oxide semiconductor layer 202 which overlaps with a bottom portion of the contact hole 217 is covered with the source electrode layer 211a or the drain electrode layer 211b. Accordingly, the adverse effect due to direct contact between the oxide semiconductor layer 202 and a deposition gas or the like in formation of the silicon whisker 215 to be described later can be prevented by the source electrode layer 211a and the drain electrode layer 211b.

Note that a silicide may be formed at interfaces between the silicon whisker 215 and the upper electrode and the lower electrode by reaction between a metal and silicon. Formation of a silicide reduces contact resistance between the silicon whisker 215 and the upper electrode and the lower electrode, which is preferable.

(Example of Manufacturing Process)

Next, an example of a method for manufacturing a transistor which is one embodiment of the present invention will be described. A method for manufacturing the transistor 201 will be described below with reference to FIGS. 5A to 5D.

First, the base layer 221 is formed over the substrate 200.

There is no particular limitation on the property of a material and the like of the substrate 200 as long as the material has heat resistance enough to withstand at least heat treatment to be performed later. For example, a glass substrate made of barium borosilicate glass, aluminoborosilicate glass, or the like; a ceramic substrate; a quartz substrate; a sapphire substrate; or the like can be used as the substrate 200. Alternatively, a single crystal semiconductor substrate or a polycrystalline semiconductor substrate made of silicon, silicon carbide, or the like; a compound semiconductor substrate made of silicon germanium or the like; an SOI substrate; or the like can be used as the substrate 200. Still alternatively, any of these substrates further provided with a semiconductor element may be used as the substrate 200.

A flexible substrate may alternatively be used as the substrate 200. When a transistor is provided over the flexible substrate, the transistor may be formed directly on the flexible substrate, or the transistor may be formed over a different substrate and then separated to be transferred to the flexible substrate. In order to separate the transistor and transfer it to the flexible substrate, a separation layer is preferably formed between the different substrate and the transistor.

The base layer 221 can be formed using a silicon nitride film, a silicon oxide film, a silicon nitride oxide film, a silicon oxynitride film, or the like, which has an insulating property. Alternatively, the base layer 221 can be formed using a material including an element of Group 13 and oxygen. As a material including an element of Group 13 and oxygen, a material including one or more of gallium oxide, aluminum oxide, aluminum gallium oxide, and gallium aluminum oxide can be given for example. The base layer 221 can be formed to have a single-layer structure or a stacked-layer structure using the above-described material. Further, the base layer 221 preferably has a stacked-layer structure of an insulating film including a material different from that included in an oxide semiconductor film to be formed later and an insulating film formed using an insulating material which contains the same kind of component as the oxide semiconductor film. For example, a stacked-layer structure of a gallium oxide film and a silicon oxide film, a stacked-layer structure of a gallium oxide film and a silicon nitride film, or the like can be employed.

Since the base layer 221 is in contact with the oxide semiconductor layer 202 to be formed later, the base layer 221 is preferably formed by a method in which an impurity such as hydrogen or water does not enter the base layer 221. This is because, when an impurity such as hydrogen or water is contained in the base layer 221, for example, an impurity such as hydrogen or water enters the oxide semiconductor film to be formed later or oxygen in the oxide semiconductor film is extracted by an impurity such as hydrogen or water, so that a back channel of the oxide semiconductor layer 202 may have lower resistance and a parasitic channel might be formed. For example, the base layer 221 is preferably formed by a sputtering method using a high-purity gas from which an impurity such as hydrogen or water is removed.

Next, the oxide semiconductor layer 202, the source electrode layer 211a, and the drain electrode layer 211b are formed over the base layer 221.

As a material used for the oxide semiconductor layer 202, the oxide semiconductor layer includes at least one element selected from In, Ga, Sn, Zn, Al, Mg, Hf and lanthanoid. For example, an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor, an In—Hf—Zn—O-based oxide semiconductor, an In—La—Zn—O-based oxide semiconductor, an In—Ce—Zn—O-based oxide semiconductor, an In—Pr—Zn—O-based oxide semiconductor, an In—Nd—Zn—O-based oxide semiconductor, an In—Sm—Zn—O-based oxide semiconductor, an In—Eu—Zn—O-based oxide semiconductor, an In—Gd—Zn—O-based oxide semiconductor, an In—Tb—Zn—O-based oxide semiconductor, an In—Dy—Zn—O-based oxide semiconductor, an In—Ho—Zn—O-based oxide semiconductor, an In—Er—Zn—O-based oxide semiconductor, an In—Tm—Zn—O-based oxide semiconductor, an In—Yb—Zn—O-based oxide semiconductor, an In—Lu—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor which are oxides of two metal elements; and an In—O-based oxide semiconductor, a Sn—O-based oxide semiconductor, and a Zn—O-based oxide semiconductor which are oxides of one metal element. Here, for example, an In—Ga—Zn—O-based material means an oxide layer containing indium (In), gallium (Ga), and zinc (Zn), and there is no particular limitation on the composition ratio thereof. Further, the In—Ga—Zn—O-based material may contain an element other than In, Ga, and Zn.

For the oxide semiconductor layer 202, a thin film using a material represented by the chemical formula, $InMO_3(ZnO)_m$ (m>0), can be used. Here, M represents one or more metal elements selected from Ga, Al, Mn, and Co. For example, M can be Ga, Ga and Al, Ga and Mn, Ga and Co, or the like.

An oxide semiconductor film used for the oxide semiconductor layer 202 can be formed by a sputtering method. Further, the oxide semiconductor film can be formed in a rare gas (typically, argon) atmosphere, an oxygen atmosphere, or a mixed atmosphere of a rare gas and oxygen. It is preferable that a high-purity gas in which an impurity such as hydrogen, water, a compound having a hydroxyl group, or a hydride is removed be used as the gas for the formation of the oxide semiconductor film.

After formation of the oxide semiconductor film, first heat treatment may be performed. Excessive water (including a hydroxyl group), hydrogen, or the like contained in the oxide semiconductor film can be removed by the first heat treatment. The temperature of the first heat treatment is higher than or equal to 350° C. and lower than the strain point of the substrate, preferably higher than or equal to 400° C. and lower than the strain point of the substrate. Further, the first heat treatment is preferably performed in a high-purity gas atmosphere which contains nitrogen or a rare gas (such as helium, neon, or argon) as its main component and from which an impurity such as water or hydrogen is removed.

Subsequently, a metal film used for the source electrode layer 211a and the drain electrode layer 211b is formed. For formation of the metal film, a material capable of forming the silicon whisker to be formed later is selected. As such a material, titanium, nickel, cobalt, or iron can be given, for example. Further, the metal film is preferably formed by a sputtering method using a high-purity gas from which an impurity such as hydrogen or water is removed as much as possible.

The oxide semiconductor film and the metal film are formed and then selectively etched to form the island oxide semiconductor layer 202 and the source and drain electrode layers 211a and 211b.

Note that it is preferable that etching conditions be optimized so as not to etch and divide the oxide semiconductor layer 202 when the metal film is etched. However, it is difficult to obtain conditions under which only the metal film is etched and the oxide semiconductor layer 202 is not etched at all. Therefore, in some cases, part of the oxide semiconductor layer 202 is etched, resulting in the formation of a groove (a recessed portion) by the etching of the metal film.

Note that a conductive layer may be provided between the oxide semiconductor layer 202 and the source and drain electrode layers 211a and 211b. For example, the conductive layer is formed using a material having a low contact resistance with the oxide semiconductor layer between the oxide semiconductor layer 202 and the source and drain electrode layers 211a and 211b, whereby contact resistance can be reduced.

Figure 5A:
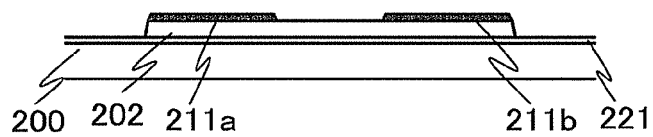
FIGS. 5A to 5D are cross-sectional views illustrating a method for manufacturing a transistor according to one embodiment of the present invention.

FIG. 5A illustrates a schematic cross-sectional view at this stage.

Next, the gate insulating layer 203 is formed.

The gate insulating layer 203 can have a single-layer structure or a stacked-layer structure of a silicon oxide film, a silicon nitride film, a silicon oxynitride film, a silicon nitride oxide film, an aluminum oxide film, or the like. An oxide insulating layer is preferably formed as a layer in contact with the oxide semiconductor layer 202. As a method for forming the gate insulating layer 203, a plasma CVD method, a sputtering method, or the like can be used. In order to prevent the gate insulating layer 203 from containing a large amount of hydrogen, the gate insulating layer 203 is preferably formed by a sputtering method.

Next, the gate electrode layer 205 is formed.

The gate electrode layer 205 can be formed with a single layer or a stacked layer of a conductive film including a metal material such as molybdenum, titanium, chromium, tantalum, tungsten, aluminum, copper, neodymium, or scandium, or an alloy material which contains any of these materials as its main component. As a method for forming the conductive film, a sputtering method can be used.

After formation of the conductive film, the conductive film is selectively etched to form the gate electrode layer 205.

Next, the interlayer insulating layer 213 is formed so as to cover the components formed through the above steps. The interlayer insulating layer 213 can be formed as appropriate using a material and a method, such as those described in Embodiment 1. After formation of an insulating film to be the interlayer insulating layer 213, the surface thereof is preferably planarized by CMP or etching.

Next, the contact hole 217 reaching the source electrode layer 211a or the drain electrode layer 211b is formed in the interlayer insulating layer 213. For etching of the interlayer insulating layer 213 and the gate insulating layer 203 in formation of the contact hole 217, a method in which the etching selectivity ratio of the interlayer insulating layer 213 and the gate insulating layer 203 with respect to the metal film used for the source electrode layer 211a and the drain electrode layer 211b is high can be employed. Further, when the size of a semiconductor element is extremely decreased, in order to suppress expansion of the contact hole due to etching, anisotropic dry etching is preferably performed. Alternatively, by a method in which the etching selectivity ratio of the interlayer insulating layer 213 with respect to the gate insulating layer 203 is high, the interlayer insulating layer 213 and the gate insulating layer 203 may be etched separately. In such a manner, even when the etching selectivity ratio of the interlayer insulating layer 213 and the gate insulating layer 203 with respect to the metal film is not high, the source electrode layer 211a and the drain electrode layer 211b can be prevented from being etched and removed. By using such a method as appropriate, the interlayer insulating layer 213 and the gate insulating layer 203 are selectively etched to form the contact hole 217.

Figure 5B:
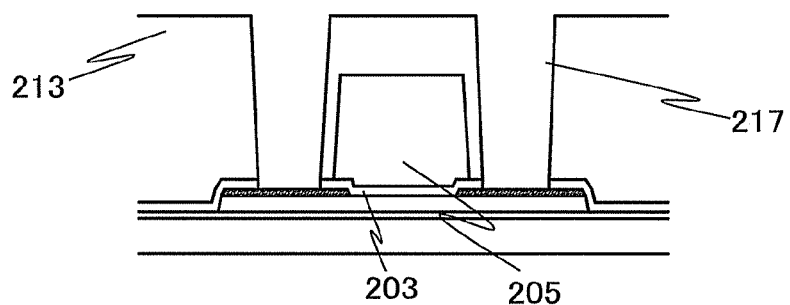

FIG. 5B illustrates a schematic cross-sectional view at this stage.

Next, the silicon whisker 215 is formed in the contact hole 217.

The silicon whisker 215 is formed by a thermal CVD method, preferably an LPCVD method as described in Embodiment 1. Since a region of the oxide semiconductor layer 202 which overlaps with the contact hole 217 is covered with the source electrode layer 211a or the drain electrode layer 211b, the silicon whisker 215 can be formed without direct contact between a deposition gas and the oxide semiconductor layer 202. Accordingly, even when the deposition gas used in an LPCVD method contains hydrogen as a component, an impurity such as hydrogen can be prevented from entering the oxide semiconductor layer. Further, an optimum deposition gas for forming the silicon whisker 215 can be selected without considering adverse effect on the oxide semiconductor layer due to the deposition gas or an impurity contained in the deposition gas.

By adding an impurity element imparting one conductivity type during formation of the silicon whisker 215, the silicon whisker 215 has conductivity. The conductivity type of the silicon whisker may be either n-type or p-type. The resistance of the silicon whisker is sufficiently reduced, whereby the contact resistance between the silicon whisker and the upper and lower electrodes can be reduced, which realizes a low-resistance contact.

The silicon whisker 215 formed in this manner has crystallinity as described in Embodiment 1. Further, a growth direction of the silicon whisker 215 and at least one of crystal orientations of crystals included in the silicon whisker may be substantially the same. The silicon whisker 215 with such crystallinity has excellent electric conductivity, whereby a low-resistance contact can be obtained.

Further, the silicon whisker 215 can have various shapes as described in Embodiment 1, which depends on a deposition method and a deposition condition.

Subsequently, an unnecessary silicon thin film formed over the interlayer insulating layer 213 during formation of the silicon whisker 215 is etched off by a method as described in Embodiment 1. Note that when the silicon thin film is not formed over the interlayer insulating layer 213, this step can be omitted.

Figure 5C:
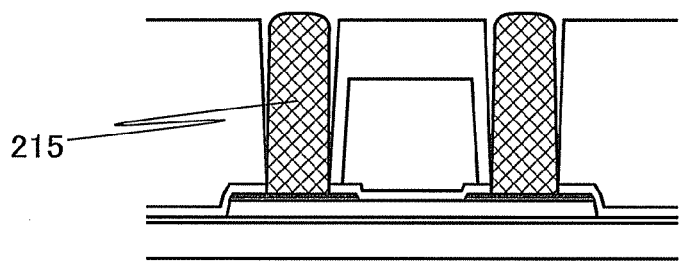

Through the above steps, the silicon whisker 215 is formed in the contact hole 217. Note that FIG. 5C illustrates a schematic cross-sectional view at this stage.

Next, the source wiring layer 219a and the drain wiring layer 219b are formed.

A conductive film used for the source wiring layer 219a and the drain wiring layer 219b can be formed using a material and a method, such as those described in Embodiment 1. After that, the conductive film is selectively etched to form the source wiring layer 219a and the drain wiring layer 219b.

Note that a silicide may be formed at interfaces between the silicon whisker 215 and the upper and lower electrodes by reaction between a metal and silicon. Formation of a silicide reduces contact resistance between the silicon whisker 215 and the upper and lower electrodes, which is preferable.

After formation of the source wiring layer 219a and the drain wiring layer 219b, second heat treatment may be performed. The second heat treatment can be performed in an atmospheric air, an inert gas atmosphere, or an oxygen atmosphere preferably at a temperature higher than or equal to 100° C. and lower than or equal to 200° C. Alternatively, the following change in the heating temperature may be performed repeatedly: the heating temperature is increased from a room temperature to a temperature higher than or equal to 100° C. and lower than or equal to 200° C. and then decreased to a room temperature.

Figure 5D:
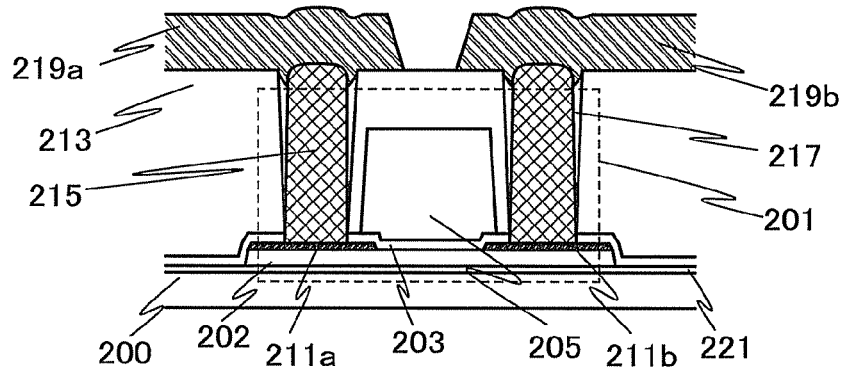

Through the above steps, the transistor 201 is formed. FIG. 5D illustrates a schematic cross-sectional view at this stage.

Figure 4B:
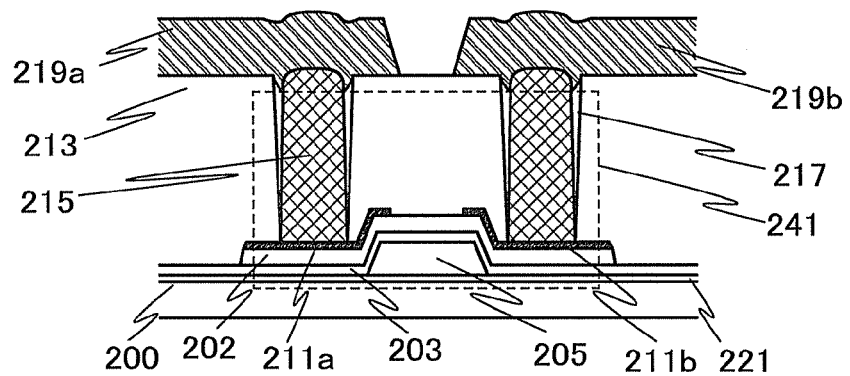

Note that in this embodiment, a structure of the top-gate transistor 201 and a method for manufacturing the top-gate transistor 201 are described; however, the structure of the transistor according to one embodiment of the present invention is not particularly limited and one embodiment of the present invention can also be applied to a bottom-gate transistor or the like. FIG. 4B illustrates an example in which the present invention is applied to a bottom-gate transistor. A transistor 241 illustrated in FIG. 4B is one of bottom-gate transistors called an inverted-staggered structure. For manufacturing the transistor 241, the gate electrode layer 205, the gate insulating layer 203, the oxide semiconductor layer 202, the source electrode layer 211a, and the drain electrode layer 211b are formed over the base layer 221 in this order and the manufacturing process after formation of the interlayer insulating layer 213 may be the same as that of the transistor 201.

Note that in this embodiment, a structure of a transistor in which an oxide semiconductor is used for a semiconductor layer and a method for manufacturing the transistor are described. However, a semiconductor used for the semiconductor layer is not limited thereto and the present invention can also be applied to a semiconductor device in which a semiconductor such as a single crystal semiconductor or a polycrystalline semiconductor such as silicon or silicon carbide or a compound semiconductor such as silicon germanium is used for a semiconductor layer.

The transistor manufactured in this manner has no adverse effect such as disconnection of the connection electrode on a narrow contact hole having a high aspect ratio required by the high integration, thereby obtaining reliable contact. Further, the transistor has no defect caused by a deposition gas in formation of the silicon whisker 215 in the contact hole, thereby obtaining favorable electric characteristics.

Note that in this embodiment, a structure of the transistor and a method for manufacturing the transistor are exemplified; however, a method for forming the contact where a conductive silicon whisker, which is in contact with a lower electrode formed using a metal at the bottom of a contact hole, is used as a connection electrode can be applied to a semiconductor device which has a connection portion of wirings through an interlayer insulating layer, such as a diode element, a capacitor, or a resistor. Also in the case where the method is applied to such a semiconductor device, the semiconductor device has no adverse effect such as disconnection of the connection electrode on a narrow contact hole having a high aspect ratio required by the high integration of a device, whereby favorable contact can be obtained.

By the structure of a semiconductor device and the method for manufacturing the semiconductor device which are exemplified in this embodiment, a semiconductor device with favorable electric characteristics in which characteristics of a semiconductor element is not damaged and a contact defect induced by the miniaturization is reduced can be realized.

Note that this embodiment can be combined with another embodiment described in this specification as appropriate.

This application is based on Japanese Patent Application Serial No. 2010-151668 filed with Japan Patent Office on Jul. 2, 2010, the entire contents of which are hereby incorporated by reference.

What is claimed is:
1. A semiconductor device comprising:
a semiconductor layer;
a lower electrode over and in contact with the semiconductor layer;
an insulating layer over the lower electrode, the insulating layer comprising a contact hole which reaches the lower electrode;
a connection electrode in the contact hole, the connection electrode being in contact with the lower electrode and including a conductive silicon whisker; and
an upper electrode over the insulating layer, the upper electrode being electrically connected to the connection electrode,
wherein a first region of the connection electrode is in contact with a side surface of the insulating layer in the contact hole,
wherein a second region of the connection electrode is not in contact with the side surface of the insulating layer in the contact hole without bending toward the side surface it contacts, and
wherein the first region and the second region are in a side surface of the connection electrode.

2. The semiconductor device according to claim 1, wherein the lower electrode includes a metal.

3. The semiconductor device according to claim 1, wherein the lower electrode includes a metal compound which includes a semiconductor included in the semiconductor layer and a metal.

4. The semiconductor device according to claim 1, further comprising a layer comprising a silicide between the lower electrode and the connection electrode.

5. The semiconductor device according to claim 1, further comprising a layer comprising a silicide between the upper electrode and the connection electrode.

6. The semiconductor device according to claim 1, wherein the connection electrode comprises an impurity.

7. The semiconductor device according to claim 1,
wherein the semiconductor layer further comprises at least one of a source region and a drain region overlapping with the lower electrode,
wherein the connection electrode a has a first type conductivity, and
wherein the one of the source region and the drain region has a second type conductivity which is different from the first type conductivity.

8. The semiconductor device according to claim 1,
wherein the semiconductor layer comprises an oxide semiconductor.

9. A semiconductor device comprising:
a semiconductor layer;
a first lower electrode and a second lower electrode each over and in contact with the semiconductor layer;
an insulating layer over the first lower electrode and the second lower electrode, the insulating layer comprising a first contact hole and a second contact hole which reach the first lower electrode and the second lower electrode, respectively;
a first connection electrode in contact with the first lower electrode in the first contact hole and a second connection electrode in contact with the second lower electrode in the second contact hole, each of the first connection electrode and the second connection electrode including a conductive silicon whisker; and
a first upper electrode and a second upper electrode over the insulating layer, the first upper electrode and the second upper electrode being electrically connected to the first connection electrode and the second connection electrode, respectively,
wherein a first region of the first connection electrode is in contact with a side surface of the insulating layer in the first contact hole without bending toward the side surface it contacts,
wherein a second region of the first connection electrode is not in contact with the side surface of the insulating layer in the first contact hole,
wherein a third region of the second connection electrode is in contact with a side surface of the insulating layer in the second contact hole with a side surface of the insulating layer in the second contact hole without bending toward the side surface it contacts,
wherein a fourth region of the second connection electrode is not in contact with the side surface of the insulating layer in the second contact hole,
wherein the first region and the second region are in a side surface of the first connection electrode, and
wherein the third region and the fourth region are in a side surface of the second connection electrode.

10. The semiconductor device according to claim 9,
wherein the first lower electrode and the second lower electrode include a metal.

11. The semiconductor device according to claim 9,
wherein the first lower electrode and the second lower electrode include a metal compound which includes a semiconductor included in the semiconductor layer and a metal.

12. The semiconductor device according to claim 9, further comprising a layer comprising a silicide between the first lower electrode and the first connection electrode and between the second lower electrode and the second connection electrode.

13. The semiconductor device according to claim 9, further comprising a layer comprising a silicide between the first upper electrode and the first connection electrode and between the second upper electrode and the second connection electrode.

14. The semiconductor device according to claim 9,
wherein the first connection electrode and the second connection electrode comprise an impurity.

15. The semiconductor device according to claim 9,
wherein the semiconductor layer further comprises a source region overlapping with the first lower electrode and a drain region overlapping with the second lower electrode,
wherein the first connection electrode and the second connection electrode have a first type conductivity, and
wherein the source region and the drain region have a second type conductivity which is different from the first type conductivity.

16. The semiconductor device according to claim 9,
wherein the semiconductor layer comprises an oxide semiconductor.

17. The semiconductor device according to claim 1,
wherein the conductive silicon whisker has a prism shape.

18. The semiconductor device according to claim 1,
wherein the conductive silicon whisker has a columnar shape.

19. The semiconductor device according to claim 1,
wherein the conductive silicon whisker is a single crystal.

20. The semiconductor device according to claim 9,
wherein each of the conductive silicon whiskers has a prism shape.

21. The semiconductor device according to claim 9,
wherein each of the conductive silicon whiskers has a columnar shape.

22. The semiconductor device according to claim 9,
wherein each of the conductive silicon whiskers is a single crystal.

23. The semiconductor device according to claim 1,
wherein the connection electrode includes a plurality of conductive silicon whiskers.

24. The semiconductor device according to claim 9,
wherein each of the first connection electrode and the second connection electrode includes a plurality of conductive silicon whiskers.

* * * * *

UNITED STATES PATENT AND TRADEMARK OFFICE
CERTIFICATE OF CORRECTION

PATENT NO. : 8,969,866 B2  
APPLICATION NO. : 13/173484  
DATED : March 3, 2015  
INVENTOR(S) : Tomokazu Yokoi et al.

Page 1 of 1

It is certified that error appears in the above-identified patent and that said Letters Patent is hereby corrected as shown below:

In the Claims:

Column 18, Line 47, Claim 1; Change "contact hole," to
--contact hole without bending toward the side surface it contacts,--.

Column 18, Lines 50 to 51, Claim 1; Change "the contact hole without bending toward the side surface it contacts, and" to --the contact hole, and--.

Column 19, Line 43 - 44, Claim 9; Change "second contact hole with a side surface of the insulating layer in the second contact hole without bending" to --second contact hole without bending--.

Signed and Sealed this  
Twenty-fifth Day of August, 2015

Michelle K. Lee  
*Director of the United States Patent and Trademark Office*